United States Patent [19]
Miki

[11] Patent Number: 5,761,076
[45] Date of Patent: Jun. 2, 1998

[54] METHOD FOR EVALUATING A DRIVING CHARACTERISTIC OF A DEVICE FOR A WIRING, BASED UPON LOWER ORDER COEFFICIENTS OF SERIES EXPANSION FORM OF COMPLEX ADMITTANCE OF THE WIRING

[75] Inventor: Yoshio Miki, Albany, Calif.

[73] Assignee: Hitachi, Ltd., Tokyo, Japan

[21] Appl. No.: 812,441

[22] Filed: Mar. 6, 1997

Related U.S. Application Data

[63] Continuation of Ser. No. 423,834, Apr. 18, 1995, abandoned.

[30] Foreign Application Priority Data

Apr. 19, 1994 [JP] Japan .................................. 6-080106

[51] Int. Cl.$^6$ ........................................... G06F 15/60
[52] U.S. Cl. ........................................ 364/488; 364/578
[58] Field of Search ............................. 364/488, 489, 364/490, 491, 578; 395/500

[56] References Cited

U.S. PATENT DOCUMENTS

| | | | |
|---|---|---|---|
| 5,295,088 | 3/1994 | Hartoog et al. | 364/578 |
| 5,359,535 | 10/1994 | Djaja | 364/489 |
| 5,404,310 | 4/1995 | Mitsuhasi | 364/490 |
| 5,446,674 | 8/1995 | Ikeda et al. | 364/489 |
| 5,452,224 | 9/1995 | Smith, Jr. et al. | 364/488 |

FOREIGN PATENT DOCUMENTS

| | | |
|---|---|---|
| 1-130279 | 5/1989 | Japan. |
| 5-55384 | 3/1993 | Japan. |

OTHER PUBLICATIONS

"Modeling the Driving Point Characteristic of Resistive Interconnect for Accurate Delay Estimation" O'Brien, 1989 IEEE pp. 512–515.

"Laxter, A New Method for Extraction of Parasitic Effects from MCM Layout," A. Simsek et al., IEEE, Apr. 1994, pp. 344–347.

(List continued on next page.)

*Primary Examiner*—Kevin J. Teska
*Assistant Examiner*—A. S. Roberts
*Attorney, Agent, or Firm*—Fay, Sharpe, Beall, Fagan, Minnich & McKee

[57] ABSTRACT

The sum of capacitance is determined by an LSI load characteristic extraction program 217, as for the capacitance of a plurality of wiring patterns constituting different segments of a wiring, between the wiring and a plurality of other wiring patterns adjacent to the wiring, and the resistance of each wiring pattern also is determined. On the basis of the resistance and capacitance, a load characteristic value 222 comprised of a plurality of predetermined lower order coefficients of series expansion of complex admittance at the driving point of that wiring is calculated. A delay calculation program 223 calculates delay time and power dissipation as the driving characteristic of logic gates which drive this wiring, according to the coefficients and a device characteristic library 212. The library 212 is generated in advance by a program 600, in which a plurality or lower order coefficients of series expansion obtained by series expanding the complex admittance of a plurality of wirings of different length, the delay time and power dissipation of a device when driving these wirings by that device are maintained. For evaluating the capacitance of respective wiring patterns, by dividing the substrate into a plurality of regions, using a region management table for registering a plurality of wiring patterns for each region, and detecting wiring patterns in the same region, the capacitance therebetween is calculated.

38 Claims, 7 Drawing Sheets

OTHER PUBLICATIONS

"A Model for Verification of Coupled High–Speed Packages and Interconnects," A. Simsek et al., IEEE, May 1993, pp. 538–541.

"Delay Modeling for GaAs DCFL Circuits," A. Kayss, et al., IEEE, GaASICS Symposium, Mar. 1993, pp. 67–70.

"Combined Topological and Functionality Based Delay Estimation Using a Layout Driven Approach for High Level Applications," C. Ramachandran et al., IEEE, Aug. 1992, pp. 72–78.

"Interconnection Delay In Very High–Speed VLSI," D. Zhou et al., IEEE, Jul. 1991, pp. 779–790.

"A New Efficient Algorithm for Analysis of Piecewise–Linear Resistive Circuits," Q. Huang et al., IEEE, 1989, pp. 2169–2172.

"Modeling the Driving–Point Characteristics of Resistive Interconnect for Accurate Delay Estimation," P. O'Brien et al., IEEE 1989, pp. 512–515.

310 IMPLEMENTATION PLANE

219 REGION MANAGEMENT TABLE

| REGION NUMBER | PARTS IDENTI-FICATION NUMBER | PARTS TABLE ADDRESS |
|---|---|---|
| 311a | ... | ... |
| ⋮ | ⋮ | ⋮ |
| 311e | 312c | |
| | 312d | |
| | 312g | |
| | 313a | |
| | 313b | |
| | 313c | |
| ⋮ | ⋮ | ⋮ |
| 311g | ... | ... |

FIG. 3C

220  PARTS INFORMATION TABLE

| PARTS IDENTIFICATION NUMBER (316) | PARTS KIND (318) | OCCUPIED LAYER (319) | SET LOCATION (320) | | | |
|---|---|---|---|---|---|---|
| | | | Xmin | Ymin | Xmax | Ymax |
| ⋮ | | | | | | |
| 312c | WIRING | 2 | 220 | 180 | 220 | 500 |
| 312d | WIRING | 1 | 220 | 350 | 390 | 350 |
| 312g | GATE | | 390 | 350 | | |
| 313a | WIRING | 2 | 350 | 349 | 350 | 580 |
| 313b | WIRING | 1 | 250 | 349 | 350 | 349 |
| 313c | WIRING | 2 | 250 | 150 | 250 | 349 |
| ⋮ | | | | | | |

FIG. 3D

221  WORK TABLE

| PARTS IDENTIFICATION NUMBER (316) | PARTS KIND (318) | OCCUPIED LAYER (319) | SET LOCATION (320) | | | |
|---|---|---|---|---|---|---|
| | | | Xmin | Ymin | Xmax | Ymax |
| 313a | WIRING | 2 | 350 | 300 | 350 | 580 |
| 313b | WIRING | 1 | 250 | 349 | 350 | 349 |

218 UNIT LENGTH RESISTANCE & CAPACITANCE TABLE

| | | UNIT LENGTH RESISTANCE (Ω/UNIT LENGTH) | STATE CODES 414 | | | | | | 412 |
|---|---|---|---|---|---|---|---|---|---|
| | | | 0 | 1 | 2 | 3 | 4 | ············ | $2^{26}-1$ |
| WIRING LAYERS | 1ST LAYER | 50.0 | 0.4 | 0.41 | 0.42 | 0.43 | 0.44 | | 0.44 |
| | 2ND LAYER | 25.0 | 0.3 | 0.32 | 0.32 | 0.33 | 0.33 | | 0.33 |
| | 3RD LAYER | 45.0 | 0.25 | 0.26 | 0.27 | 0.28 | 0.29 | | 0.29 |
| | ⋮ | ⋮ | ⋮ | ⋮ | ⋮ | ⋮ | ⋮ | | ⋮ |

411  413

UNIT LENGTH CAPACITANCE (pF/UNIT LENGTH)

FIG. 8
212 DEVICE CHARACTERISTIC LIBRARY
| DEVICE KIND | LOAD CHARACTERISTIC VALUES | | | INPUT TRAN-SIENT TIME | OUTPUT DELAY TIME | OUTPUT TRANSIENT TIME | POWER DISSI-PATION |
|---|---|---|---|---|---|---|---|
| | $y_1$ | $y_2$ | $y_3$ | | | | |
| NAND4 | | | | | | | |
| | | | | | | | |
| | | | | | | | |
| | | | | | | | |
| | | | | | | | |
| NAND5 | | | | | | | |
810, 820, 830, 840, 850, 860
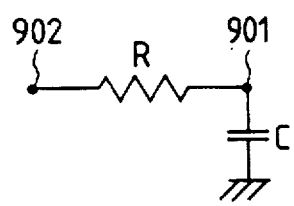
FIG. 9A
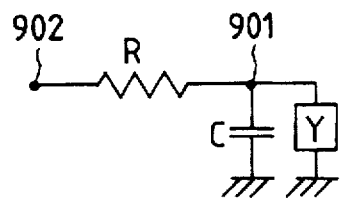
FIG. 9B

METHOD FOR EVALUATING A DRIVING CHARACTERISTIC OF A DEVICE FOR A WIRING, BASED UPON LOWER ORDER COEFFICIENTS OF SERIES EXPANSION FORM OF COMPLEX ADMITTANCE OF THE WIRING

This is a continuation of U.S. application Ser. No. 08/423,834, filed Apr. 18, 1995, now abandoned.

BACKGROUND OF THE INVENTION

The present invention relates to a method for evaluating a driving characteristic of a device, more particularly to a method for evaluating a driving characteristic, such as signal delay time and power dissipation, of a device which drives a wiring in a circuit according to the design data of the circuit manufactured in an LSI or on a printed circuit board produced by using computer.

In prior art, as disclosed in Japanese Patent Laid-Open No. 55384/1993 (referred to as the first prior art hereinafter), for the calculation of a circuit consisting of logical gates and wirings connected thereto, which wiring was represented by any equivalent circuit consisting of a capacitance element having the entire capacitance of that wiring. This means that the capacitance between that wiring and other wirings and that between that wiring and the substrate is to be determined at first, then the sum of the capacitance values is treated as the entire capacitance of that wiring. Then the delay time of a non-linear element such as a logic gate, which was generated when it is connected to the wiring, was determined. Thereafter the time corresponding to the RC time constant that is a product of the entire wiring capacitance and an output resistance of the device was determined in case the delay time of that non-linear element had to be determined as a driving characteristic.

To extract the capacitance of the respective wirings, in Japanese Patent Laid-Open 130279/1988 (referred to as the second prior art hereinafter) for example, searching adjacent conductors was performed over the entire LSI or printed circuit board. In this method, all of the wiring pattern data is sorted by keying with the coordinates to search the nearest conductor (such as wiring pattern) in accordance with the values of coordinates in order to calculate the capacitance between the conductors. For the effectiveness of searching process, the entire LSI or the printed circuit board is swept with a slit of narrow width for the calculation of the capacitance between wiring patterns which pass across the small area of the slit to be examined.

SUMMARY OF THE INVENTION

In the first Prior Art stated above, only the sum of capacitance was considered for the load to the non-linear element. For example, in the load of high wiring resistance in such a case as LSI or printed circuit board of fine process, the capacitance of a point far away from the point to which the non-linear element is connected may be evaluated to be large. Thus the driving characteristics such as delay time of a device driving that wiring may be largely different from the actual value.

As in the second prior art stated above, the method of using a narrow slit to sweep a plane for determining the capacitance between wiring patterns and that between the wiring pattern and the substrate requires to stop slit scan at each point where the end coordinates of implemented parts exists so as to perform the capacitance calculation between the parts included in the area of the slit. This may cause slit scan to be stopped frequently and processing time to be increased in case of high density implementation of parts and wiring pattern.

One object of the present invention is to provide a method for evaluating load characteristic values of a wiring so as not to evaluate unreasonably large capacitance of a point on the wiring far away from the connecting point of the wiring with a non-linear element and a method by means of the method for evaluating a driving characteristic of a device such as delay value and power dissipation of that device when the device drives that wiring.

Another object of the present invention is to provide a method for evaluating capacitance, being capable of calculating the wiring capacitance without increasing the processing time even with high density implementation of associated parts and wiring patterns.

To achieve the first object, the method for evaluating a driving characteristic of a device according to the present invention comprises the steps of:

calculating, based on design data, the capacitance between each of a group of wiring patterns constituting one of a plurality of wirings included in a circuit to be implemented on a substrate and a plurality of wiring patterns positioned in the neighborhood of the group of wiring patterns;

calculating, based on the design data, the resistance of each of the group of wiring patterns;

determining, based on the resistance and the capacitance respectively calculated for each of the group of wiring patterns, a predetermined number of a plurality of lower order coefficients of series expansion of complex admittance of the one of a plurality of wirings; and determining a driving characteristic representing operational characteristic of a logic gate when driving one of wirings by the device by means of the determined plural coefficients.

To achieve the second object of the present invention, the method for evaluating a wiring capacitance according to the present invention comprises the steps of:

(a) storing in a storage device of a data processing apparatus, parts information concerning a plurality of wiring patterns constituting different regions of a plurality of wirings which constitute a circuit to be implemented on a substrate either of an LSI or a printed circuit board;

(b) dividing the substrate into a plurality of areas;

(c) detecting a group of wiring patterns associated to respective areas based on the stored parts information concerning a plurality of wiring patterns;

(d) storing in a plurality of area management table provided for each of corresponding areas and kept in the storage device the address of storage location in the storage device for storing parts information concerning each of a group of wiring patterns detected to belong to that area; and (e) calculating the capacitance between each wiring pattern and a plurality of other wiring patterns, the calculating step comprising the steps of:

(e1) reading out the address of the stored location of each of parts information of a group of other wiring patterns associated to the area to which that wiring pattern belongs from one area management table provided for that area;

(e2) reading out parts information concerning to each of the group of other wiring patterns from the storage device in accordance with the address read for each of the group of other wiring pattern;

(e3) determining whether or not other wiring patterns have region each which is located in a predetermined distance in accordance with the read parts information relating to each of the group of other wiring patterns:

(e4) calculating capacitance between each or other wiring patterns and each of the wiring patterns if each of other wiring patterns has region each which is located in a predetermined distance from each wiring pattern; and (e5) accumulating capacitance which is calculated between each of the group of other wiring patterns and each of the wiring patterns to thereby determine the capacitance of each of the wiring pattern.

BRIEF DESCRIPTION OF THE DRAWINGS

FIG. 3C shows a schematic diagram indicating the structure of parts information table used in the system of FIG. 1;

FIG. 3D shows a schematic diagram indicating the structure of work table used in the system of FIG. 1;

FIG. 8 shows a schematic diagram indicating the structure of characteristic library generated by the device characteristic library generation program of FIG. 6;

FIG. 9A shows an equivalent circuit of a wiring pattern used by the LSI circuit load characteristic extraction program of FIG. 2; and FIG. 9B shows an equivalent circuit of combined two wiring patterns used by the LSI circuit load characteristic extraction program of FIG. 2.

DESCRIPTION OF AN EMBODIMENT

Figure 1:
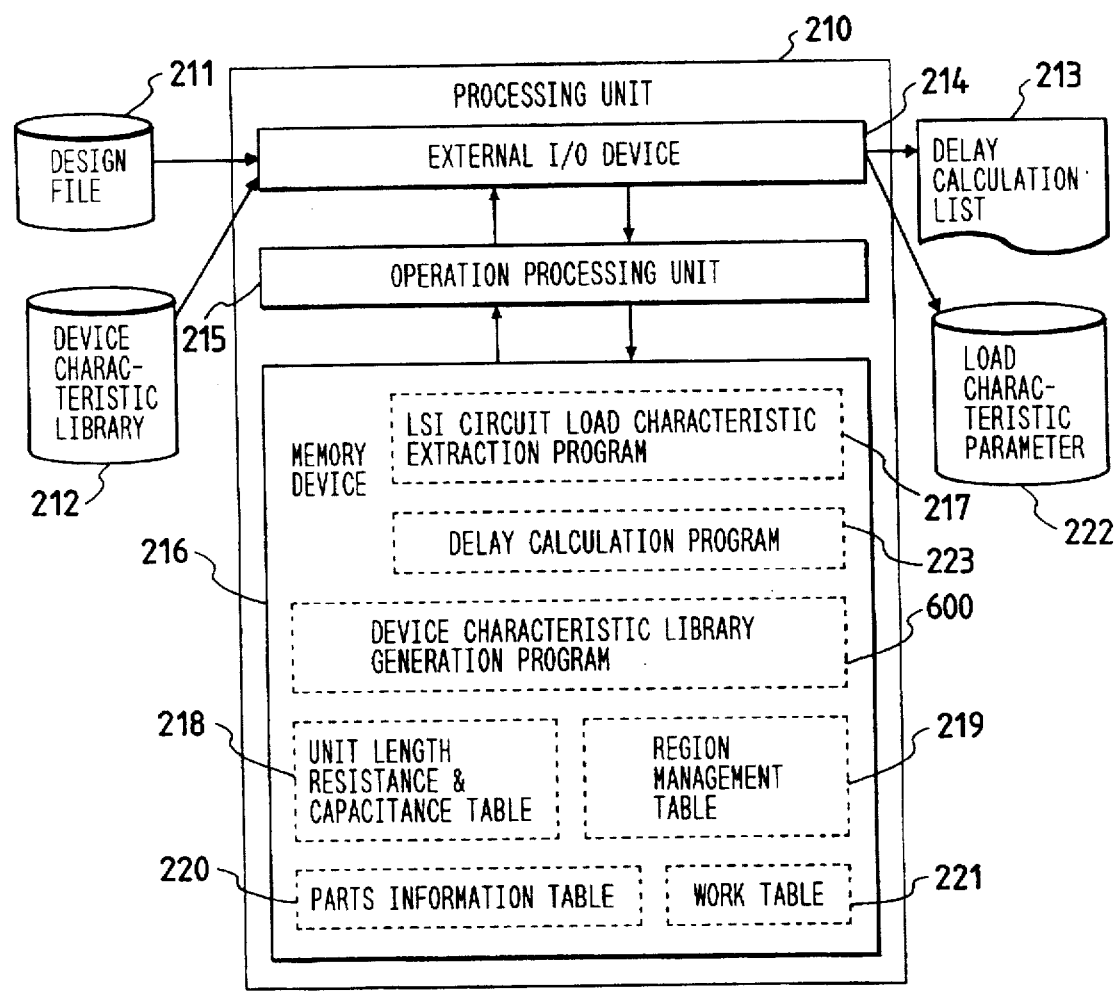
FIG. 1 shows a schematic diagram of an embodiment of the delay verification system according to the present invention.

FIG. 1 shows a schematic diagram of the delay verification system using the method of evaluating load characteristic of wirings and the method of evaluating a driving characteristic of a device which drives the wiring according to the present invention. In FIG. 1, reference numeral 210 denotes a processing apparatus such as computer, 211 a design file containing parts information such as kind, location, form of all parts including wiring patterns as well as wiring resistance and wiring capacitance for unit length, 212 a device characteristic library storing driving characteristics of devices such as logic gates having non-linear characteristic, 213 a delay list obtained as the result of the execution of the delay verification system. The input to and output from the design file 211, the device characteristic library 212, and the delay list 213 pass through the external input/output device 214. On the other hand, in this embodiment, a load characteristic extraction program 217, a delay calculation program 223, and a device characteristic library generation program 600 which are stored in such storage device 216 are used as semiconductor memory. These programs are executed by an operation processing unit 215. The load characteristic extraction program 217 extracts a load characteristic values 222 of the load circuit constituting of respective wirings. The delay calculation program 223 calculates the driving characteristics indicating the driving characteristic of a device when any one device which is connected to the starting point of each wiring drives the wiring. More specifically, it calculates the delay value and power dissipation of that device and the transient time of output signal as the driving characteristics. It should be noted that in this embodiment the delay time of the wiring is also calculated to calculate the sum of the delay time. These driving characteristics are output as the delay list 213. The device characteristic library generation program 600 generates the device characteristic library 212 in advance. This embodiment is characterized by calculating the capacitance and resistance of each of a plurality of wiring patterns constituting different part of respective wiring, and then, as the load characteristic, a predetermined number of low order coefficients of series expansion of the complex admittance calculated from the resistance and the capacitance of the wiring patterns for the load, and then by using these coefficients calculating a driving characteristic of a device driving the wiring such as delay time. In addition, it is characterized by when calculating the capacitance of each wiring pattern, dividing a substrate into a plurality of regions, registering a plurality of wiring patterns residing in respective region into the region management table 219 provided for each region, and searching at high speed a plurality of other wiring patterns located in the same region as that wiring patterns to calculate the capacitance between the wiring pattern and a plurality of searched other wiring patterns in order to thereby provide the calculation of the capacitance of each wiring pattern at high speed.

Figure 2:
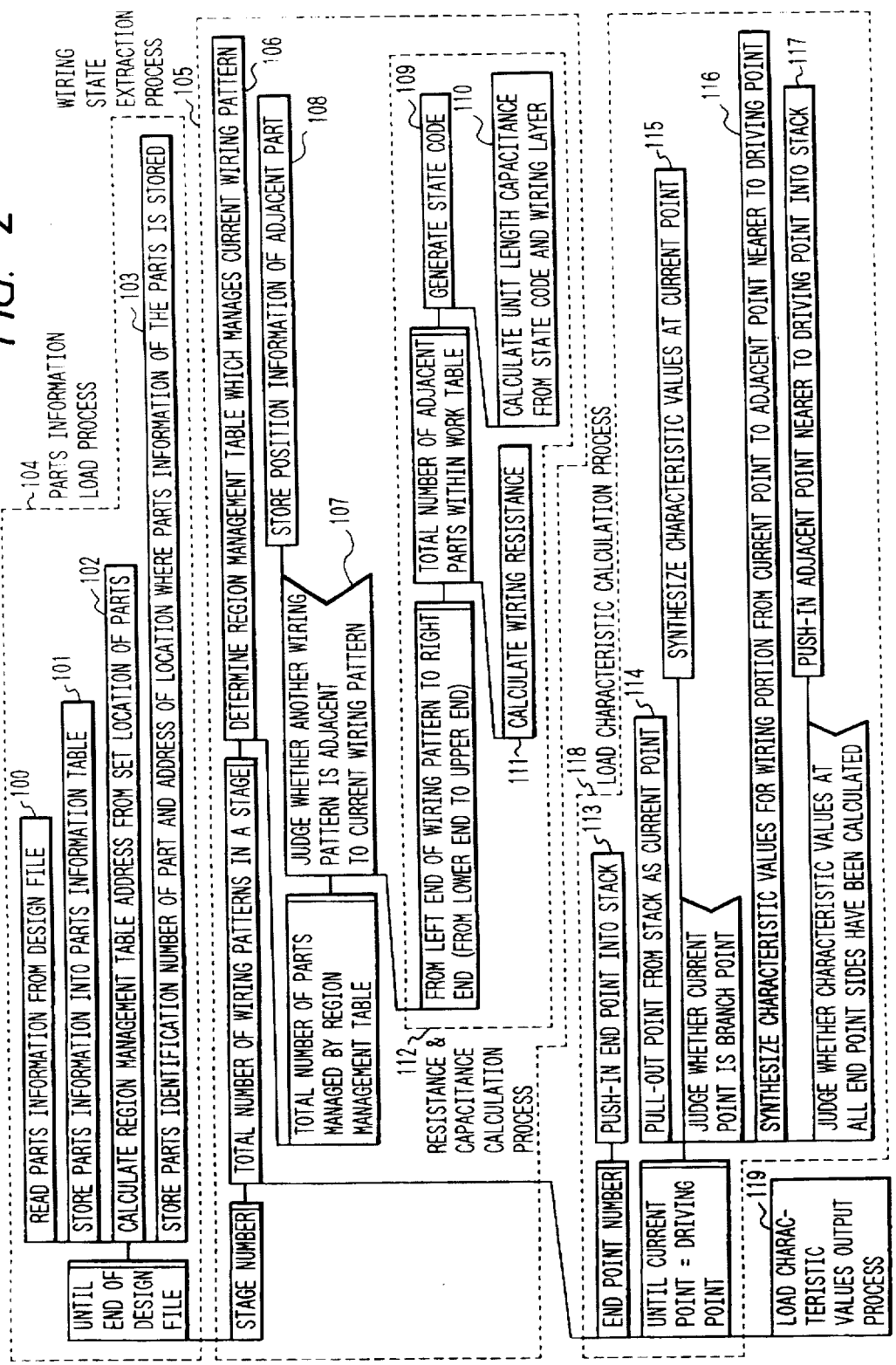
FIG. 2 shows a flow chart indicating the processing steps of the LSI circuit load characteristic extracting program used in the system of FIG. 1.

Now referring to FIG. 2, the operation or the load characteristic extraction program 217 is described. As the first input information, information of the circuit to be verified in delay is prepared as the design file 211 including the position and the kind of parts implemented on the substrate of LSI or printed circuit board, the position of end points of the wiring used for the interconnection of parts, the wiring layer, and the wiring width. As the second input information, the device characteristic library 212 is generated by using the method further described below, which library 212 contains the relationships between load characteristic values indicating the load characteristic, and corresponding driving characteristics such as the delay value of the device having non-linear characteristic such as transistors and logic gates. In the parts information load process 104, the contents of design data is sequentially read out from the design file 211 as the parts information (100) to store in the parts information table 220 (101). The parts information table 220 is divided into fields for storing: a parts identification number 316 which is a proper ID number of parts, a parts kind 318 as an attribute of parts, an occupied layer 319 indicating a wiring layer physically used by the parts, set location coordinates 320 which represent the parts set location as coordinates. Then the address of the region management table 219 is calculated from the set location coordinates 320 contained in the parts information (102) to write parts identification number 316 and parts table address 317 which is the already stored address of the parts information table 220 (103). As the method of calculating the address of region management table from the set location is quite similar to the process 106 described below, the description is omitted here. Here, the assignment of the region management table 219 is divided into several management regions 311a–311g, as shown in the implementation plane corresponding to the entire LSI or the printed circuit board of FIG. 3A, and each management region corresponds to the region number 315 of the region management table 219. The wiring pattern 312b–312f, which are parts themselves and connect to other parts, pass through several management regions to connect logic gates 312a, 312g, and 312h of the stage in question. For information about these parts, their kind and set location are registered in the parts information table 220. The parts identification number 316 and parts table address 317 indicating the stored location of the parts information table 220 are stored in the region management table 219 which corresponds to the management region in which these parts exist. In the example shown in FIG. 3B, there are wiring patterns 312c and 312d and logic gates 312g in the management region 311e, for example, and wiring patterns 313a, 313b, and 313c connecting logic gates not remarked here are managed.

Figures 3A, 3B:
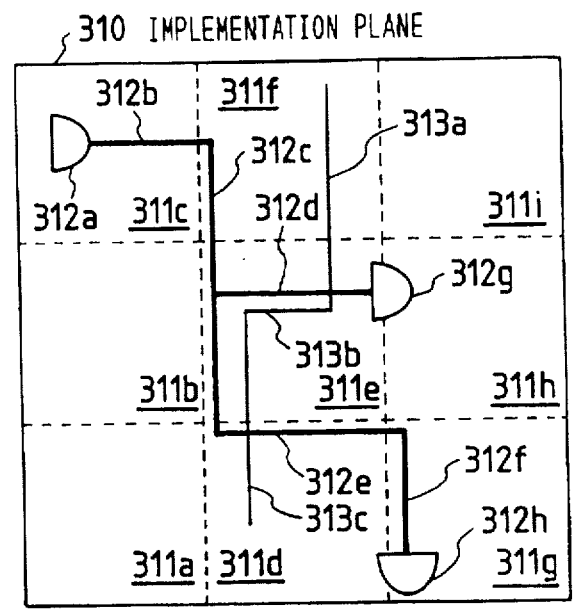
FIG. 3A shows a schematic diagram of a plurality of wiring patterns and a plurality of logic gates constituting a circuit on an LSI substrate.
FIG. 3B shows a schematic diagram indicating the structure of area management table used in the system of FIG. 1.

Referring again to the flow chart of FIG. 2, which indicates the sequence of process, a wiring state extracting process 105 is performed for determining capacitance per unit length from the relationship between all of the wiring patterns after the parts information load process 104. Here the region management table in which remarked wiring patterns are managed is determined (106) for all of the wiring patterns of which the relationship is to be determined. To do this, integral division of the set location coordinates 320 with the values of width and height of the management region 311 is performed. For example, in case of wiring pattern 312d as shown in FIG. 3, if the size of the managed region is 200 in both vertical and horizontal directions, integral division of the end coordinates results in 220/200=1, and 350/200=1. This corresponds to the region forward by one (1) in both X- and Y-direction in FIG. 2, i.e., the region 311e. Then, if any of the parts included in the determined management region are adjacent to the remarked wiring pattern (107) than position information of the adjacent parts are stored in the work table 221 (108). Here "adjacent" represents running parallel or crossing within ±1 of coordinate values, except that parts equipotential to the remarked wiring pattern are not included. In the examples shown in FIGS. 3A, 3B, 3C, and 3D, with reference to the region management table 219, parts 312c, 312g, 313a, 313b, and 313c are all listed, and their detailed parts information are available by referencing to the parts information table 220 via a parts table address 317. The wiring pattern 312c which is equipotential to the wiring pattern 312d and a logic gate 312g are excluded as the relationship for calculating capacity, so that only wiring patterns 313a and 313b are extracted which are adjacent and stored in the work table 221. For the purpose of simplicity, FIG. 3A shows an example in which the borders of respective regions are clearly separated. However, in practice there are parts near the border and there is the need for extracting the relationship therebetween. To do this, both borders of adjacent regions are to be superimposed so as to manage the figures positioned in the superposed region by the region management table.

As stated above, the capacitance and resistance of wiring patterns with the adjacent relationships extracted are defined by the capacitance/resistance calculation process 112. To generate the state code, the process checks whether other parts exist or not, i.e., existence of conductors, by every one coordinate value in the longitudinal direction of the wiring patterns in the work table (109). For the generation procedure of the state code, it may be possible that, for example, by assuming a cubic having height, width and depth of ±1 and with the coordinates in current position on the wiring pattern in current position being in the center, the existence/absence of parts on each coordinate in and on the cubic is associated to one bit to enumerate such that the bit is set to 1 if there are parts at that position. The capacitance per unit length of the wiring pattern position is determined by the relationships in position of the conductor adjacent to the current position on the wiring pattern. Unit length capacitance at any relationships of adjacent conductors is determined in advance in the design file 211, whose contents corresponding to the unit length resistance/capacitance table 218 of FIG. 4. The unit length capacitance may be determined from the combination of the wiring layer 411 that the wiring pattern belongs to and the state code 412 corresponding to the relationships. In the process 110 shown in FIG. 2, by using the state code determined in the previous process 109 as search key to search the unit length resistance/capacitance table 218, the unit length capacitance 413 at the current position on the wiring is determined. The processes 109 and 110 as mentioned above are performed from left edge to right edge or from bottom edge to top edge of the wiring pattern, and each unit length capacitance is accumulated so that ultimately wiring capacitance for one wiring pattern is determined. As the wiring resistance does not depend on relationships of conductors, the wiring resistance may be determined as the product of the length of the wiring pattern and the unit length resistance 414 determined from unit length resistance/capacitance table 218 by referring to the occupied layer of the wiring pattern (111).

Figures 4, 5:
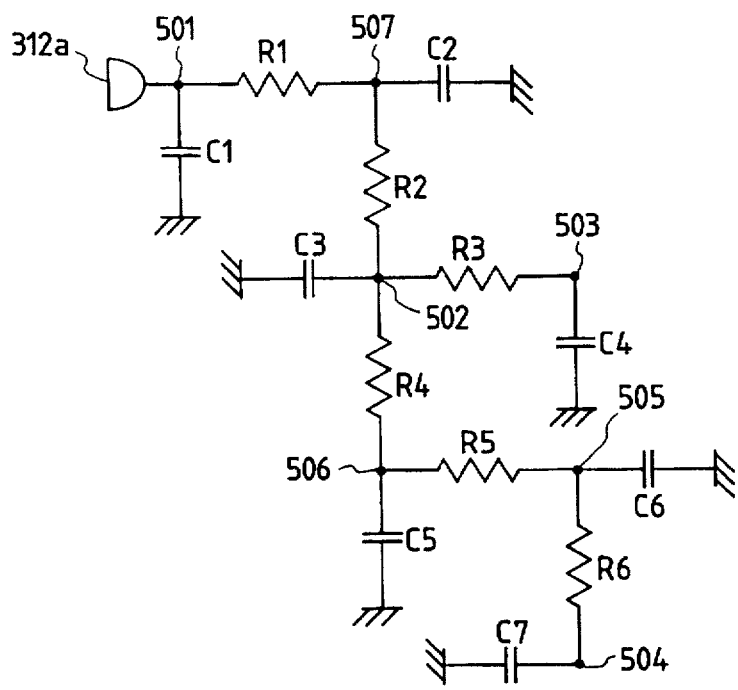
FIG. 4 shows a schematic diagram indicating the structure of unit-length resistance/capacitance table used in the system of FIG. 1.
FIG. 5 shows an example of equivalent circuits which is evaluated by the LSI circuit load characteristic extraction program of FIG. 2 for the wiring shown in FIG. 3A.

From the wiring state extraction process 105 and the capacitance/resistance calculation process 112, the capacitance and resistance of all of the wiring pattern of the load are determined. FIG. 5 shows a circuit diagram of the wiring pattern shown as implemented plane 310 in FIG. 3A, wherein reference numeral 312a denotes a logic gate driving a load, 501 a driving point, 502 a branch point of wiring pattern, 503 and 504 end points for the whole load, 505, 506, and 507 connection points connecting two wiring patterns. In the following description these are referenced each as to "point" unless they have to be distinguished to be either connection point or branch point or end point.

The load characteristic calculation process 118 of FIG. 2 is described below with reference to FIG. 5. In this process a group of wiring patterns which constitute different parts of respective wirings is detected. In this embodiment, the coordinates of the wiring layer in which the wiring pattern resides and of a pair of end points of the wiring pattern are included in the parts information of respective wiring pattern. Then by determining the relationship of connection between wiring pattern each other based on the above information, the group of wiring pattern may be detected. In this embodiment, it is assumed that two wiring patterns both pertaining to the same or different layers and having the conformed X- and Y-coordinates of end points are connected to each other. In addition, based on this parts information, the positional relationship between the respective group of wiring patterns constituting each wiring is distinguished. That is, the first wiring pattern connected to the logic gate which drives that wiring, the second wiring pattern which is connected to the first wiring pattern, the wiring pattern connected to the branch point of that wiring, or the wiring pattern including the end point of that wiring, and so on, is detected. As such, for each wiring, after a group of the wiring pattern constituting each wiring is detected and then the mutual relationship of positions of these wiring patterns are distinguished, following process is performed on the group of wiring pattern constituting the respective wirings.

All of the end points of respective wirings are registered in a stack (113). In the example of FIG. 5, the end point 503 and the end point 504 are registered in the stack. The stack may be of any suitable structure if its data structure has first-in-first-out (FIFO) capability. Then, the following process is iterated until the driving point appears. At the beginning of the iteration process, a point is loaded from the stack to form the current point of the process (114). In the embodiment of FIG. 5, one of the end points 503 and 504 which is registered to the stack at first is the current point. Here the end point 504 being assumed to be the current point, load characteristic values are calculated in respect to the point 505 toward the driving point connected from the current point via a wiring pattern (116). More specifically, for a wiring pattern shown in FIGS. 9A, let point 901 be the current point and point 902 be the point toward the driving point, if the load characteristic value at the point 901 is represented by three real numbers, $y_1$, $y_2$, and $y_3$, then the characteristic values at the point 902 $y_1'$, $y_2'$, and $y_3'$ are represented by the following equation.

$$y_1' = y_1 + C$$

$$y_2' = y_2 - R(y_1 + C)^2$$

$$y_3' = y_3 - 2Ry_2(y_1 + C) + R^2(y_1 + C)^3 \quad (1)$$

The basis of above calculation is now explained. As shown in FIG. 9B, if the complex admittance Y is connected to the point 901 and to the end point, the complex admittance Y' from the point 902 is expressed as follows:

$$Y' = 1/(R + 1/(Y + sC)) \quad (2)$$

where s is complex variable. In the category of electric circuit theory, Y' can only be expressed as abstract complex function in the equation (2) above. Therefore, it is assumed that Y' can be series expanded for obtaining computable values on a computer, and that the first, second, and third order real coefficients are defined as the load characteristic values representing load characteristic instead of complex admittance, then Y' may be defined as follows:

$$Y' = y_1's + y_2's^2 + y_3's^3 \quad (3)$$

Since this meets to the expanded form of the equation (2), it is possible to relate as follows:

$$y_1's + y_2's^2 + y_3's^3 = (y_1 + C)s[y_2 - R(y_1 + C)^2s^2 + [y_3 - 2Ry_2(y_1 + C) + R^2(y_1 + C)^3]s^2 \quad (4)$$

Therefore the equation (1) may be derived from this relation.

Now referring back to the examples shown in FIG. 2 and FIG. 5, since the point 504 is an end point, it is supposed that its load characteristic values are all zeroes, so that according to the equation (1), the load characteristic $y_1$, $y_2$, and $y_3$ at the point 505 are as follows:

$$y_1 = C7$$

$$y_2 = -R6C7^2$$

$$y_3 = R6^2C7^3 \quad (5)$$

In FIG. 2, the process will continue and, if for the new point toward the driving point, all of the load characteristic values have been calculated according to the load between that point and the end point, the position and the load characteristic values of the new point toward the driving point are stacked in the stack (117). In general, for the connecting points such as 505, 506, and 507, this judgment condition is always satisfied so that the current point 505 is stacked in the stack. This judgment has its significance only in case of branch points. As mentioned above, as the stack has FIFO capability, when a point is retrieved from the stack for the next time, the point 505 is the current point. Therefore the same procedure as mentioned above is iterated for the process after the synthesis represented by the equation (1), the process proceed through the connecting point 506 to the branch 502. For the next iteration the end point 503 is the current point, and the load characteristic values to the branch point 502 is calculated. As the next current point is the point 502 which is a branch point, the load characteristic value synthesis process 115 at the branch point including the following equation is performed, as the preprocess prior to the synthesis process 116.

$$y_1 = \Sigma y_{1i}$$

$$y_2 = \Sigma y_{2i}$$

$$y_3 = \Sigma y_{3i} \quad (6)$$

where i corresponds to the branch toward the end point connected to the branch point, and $y_{1i}$, $y_{2i}$, and $y_{3i}$ represent respective load characteristic values calculated from respective direction. Also, $y_1$, $y_2$, and $y_3$ are new load characteristic values at the branch point. Since in the equation (6) the load characteristic values are derived from the complex admittance, this is a summing process following the complex admittance of parallel connection. The process from a branch point toward a driving point is expanded similarly to the preceded example, finally the driving point 501 is the current point than the load characteristic calculation process 118 terminates. At this point, as the load characteristic values at the driving point 501 is already calculated, these values are used for the load characteristic values for the entire load. These values are output to an external storage device such as a magnetic disk device by the load characteristic values output process 119 as the load characteristic values 222.

The delay calculation program 223 shown in FIG. 1 calculates the delay time, power dissipation of a device, and output transient time of a device as device's driving characteristic when connecting the device to the starting point of respective wiring. It should be noted that in the embodiment, the delay time of wiring is also calculated by the delay calculation program 223 to be output to the delay list 213 together with driving characteristics. The device characteristic library 212 is used to calculate these driving characteristics. In this library, as shown in FIG. 8, for respective kind of devices used for the target circuitry, a first set of values comprised of the load characteristic values $y_1$, $y_2$, and $y_3$, and the transient time of an input signal 830 which is input to the device, and a second set determined for that set and comprised of the output delay time 840, the transient time of output signal 850, and the power dissipation of that device 860 are maintained as one pair. Those sets are plurally held for the same device. More specifically, for the three load characteristic values of each wiring calculated by the load characteristic extraction method and the one input transient time of the signal expected to be input to the logic gate driving that wiring, the nearest at most eight sats are chosen among sets of the driving characteristic in the device characteristic library 212. Here, the nearest sets of the driving characteristic are determined from this library as follows. For, the purpose of simplicity, the load characteristic values calculated by the load characteristic extraction method are defined as the input load characteristic values. At first, for one of the three input load characteristic values, a bigger closest value and a smaller closest value are searched in the load characteristic values in the device characteristic library 212 to determine at most two sets of driving characteristic making a pair with those load characteristic values in the device characteristic library 212. If the device characteristic library 212 has the same value as the input load characteristic value, only one set of driving characteristic is determined. The same determinations of set of the driving characteristic are repeated for the remaining two input load characteristic values and for the input transient time. Since at most two sets of the driving characteristic are determined for each input value, totally at most eight sets can be determined. Finally, at most eight sets of output delay times 840 are interpolated to obtain desired device delay value. Similarly, the power dissipation and the output signal transient of that device are determined.

In this embodiment, the delay calculation program 223 calculates the delay of the wiring from its driving point to the end point for the remarked wiring. This delay may be obtained, for example, by calculating the product of the resistance and capacitance, i.e., RC time constants for respective of a plurality of patterns constituting that wiring, then summing these along the path from the driving point to the end point. The delay calculation program 223 acquires the sums of the delay time for each of wirings to output the sums as part of the delay list 213. It should be noted that the previously determined transient time of the output signal is also included in the delay list 213 for the output.

Figure 6:
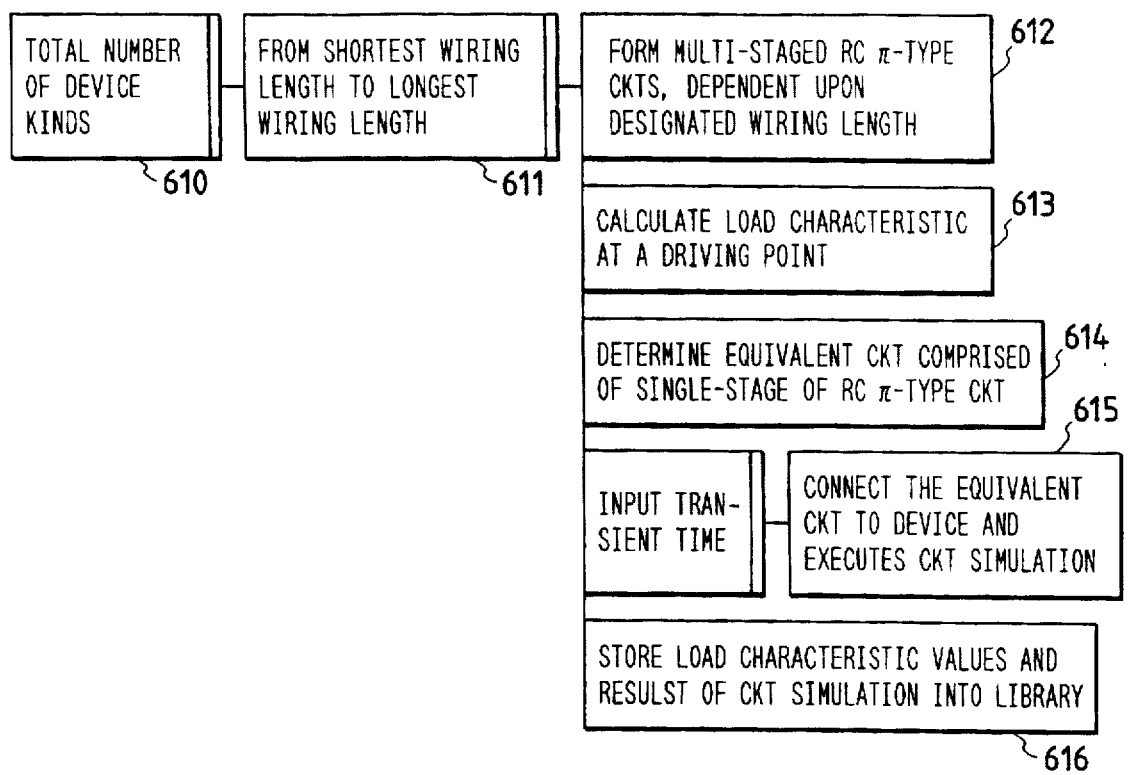
FIG. 6 shows a flow chart of the device characteristic library generation program used in the system of FIG. 1.
Figure 7A:
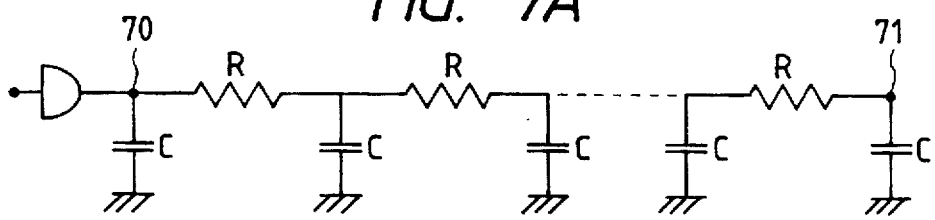
FIG. 7A shows an equivalent circuit of an virtual wiring, which is used by the device characteristic library generation program of FIG. 6.
Figure 7B:
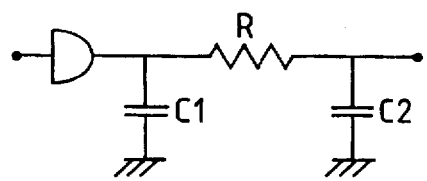
FIG. 7B shows a virtual RC-π type equivalent circuit used by the device characteristic library generation program of FIG. 6.

Referring now to FIGS. 6 to 8, the method for generating device characteristic library by the device characteristic library generation program 600 is described below. FIG. 6 shows a flow chart indicating the sequence of generating characteristic library for calculating the delay time and the power dissipation of logic gates based on the load characteristic values. The whole sequence of the method is iterated as many as the kinds of the devices to determine the characteristic library (610). For determining the device characteristic when load varies diversely, the wiring length from shortest to longest in the range possibly actually connected to a device is included as the subject for calculation (611), this wiring is represented by a multi-stage RC π-type ladder circuit as shown in FIG. 7A. The number of stages is set, so that the RC time constant for one stage corresponds to the time precision or the resolution of the characteristic library. Then by using the equation (1), the load characteristic values at the driving point 70 are calculated (613). At this point, it should be noted that, for the capacitance of wiring of each stage, the capacitance for unit length is previously determined, then the wiring capacitance for each stage is determined from this constant value and the wiring length of that stage. This is different from the method of determining the capacitance of each wiring pattern previously determined in the step 110 of FIG. 2. The same constant value is always fixedly used regardless of the total length of wiring. Similarly, a fixed value is used for the resistance of the wiring for unit length regardless of the wiring length such that the resistance of respective stage may be determined with this fixed value and the length of wiring in that stage. In addition, for the capacitance of the wirings, since there is no branch point in the circuit shown in FIG. 7A, the load characteristic values at the driving point 70 may be obtained by solely iterating the process 116 of FIG. 2 from the end point V1. On the other hand, the load characteristic values $y_1$, $y_2$, and $y_3$ of the one stage RC π-type circuit shown in FIG. 7B are as follows:

$$y_1 = C1 + C2$$

$$y_2 = -RC2^2$$

$$y_3 = R^2C2^3 \qquad (7)$$

In the process 614, by solving the element of the one stage RC π-type circuit, C1, C2, and R in accordance with the relation of the equation (7) from the load characteristic values determined in the process 613, one stage RC π-type circuit equivalent to FIG. 7A is obtained. Then, the equivalent circuit thus obtained is connected to the device for which the library is generated, so that the output delay time, the power dissipation, and the output transient time of the device when the input transient time of the device is varied are determined by simulation (615). Finally, as shown in FIG. 8, the results of the simulation, i. e., an output delay time 840, an output transient time 850, and an power dissipation 860 are stored so as to correspond to the device kind 810 representing the kind of the device, the load characteristic values 820 determined in the process 613, and the input transient time 830 used in the process 615.

According to the present embodiment, as the load characteristics of the wiring pattern connected to the load is represented by using the load characteristic values derived from the complex admittance, load characteristics that cannot be dealt with the prior art are determined, in which, for example, with the load with a wiring pattern having high resistance due to fine process, such as 500 ohms, 10 mm, the characteristics may not be affected for the device which drives this load even though the length of wiring is prolonged to beyond 10 mm.

Also, for determining the capacitance between wiring patterns of the load and between the wiring pattern and the substrate, the method of the present invention takes as shorter as searching the number of all parts divided by the number of regions, while the methods in the prior art of searching whole implemented plane take as longer as using the binary search algorithm for all parts.

What is claimed is:

1. A method for evaluating a driving characteristic of a device for one of a plurality of wirings included in a circuit to be formed on a substrate, based upon design data which includes data specifying wiring patterns which constitute different portions of the plurality of wirings, the driving characteristic indicating a characteristic of an operation of said device at driving of said one wiring by said device, said method comprising the steps executed by a computer, the steps including:

(a) calculating a value of a static capacitance between each of a group of wiring patterns constituting one of said plurality of wirings and other wiring patterns constituting others of said plurality of wiring patterns, based upon said design data;

(b) calculating a value of resistance of each of said group of wiring patterns, based upon said design data;

(c) determining a group of lower-order coefficients of series expansion form of complex admittance of said one wiring, based upon said value of static capacitance calculated for each of said group of wiring patterns and said value of resistance calculated for said each of said group of wiring patterns; and (d) determining a driving characteristic of a device connected to said one wiring, based upon said group of lower-order coefficients as determined for said one wiring.

2. A method for evaluating a driving characteristic of a device for a wiring according to claim 1, further comprising the steps of:

(e) determining a group of lower-order coefficients of series expansion form of complex admittance of each of a plurality of reference wirings predetermined for evaluation purpose;

(f) determining a plurality of reference driving characteristics of said device each of which indicates a driving characteristic of said device at driving of one of said plurality of reference wirings by said device; and (g) storing a plurality of characteristic data each of which includes a group of coefficients as determined for one of said plurality of reference wirings and a driving characteristic as determined for said one reference wiring;

wherein said determining of said driving characteristic of said device for said one wiring comprises:

(d1) determining said driving characteristic of said device for said one wiring, based upon said group of lower-order coefficients as determined for said one wiring and said plurality of stored characteristic data.

3. A method for evaluating a driving characteristic according to claim 2, wherein said determining step (d1) comprises:

selecting plural ones of said plurality of characteristic data each of which includes a group of coefficients whose values are relatively closer to said group of coefficients as determined for said one wiring; and interpolating a plurality of driving characteristics included in said selected plural characteristic data, by said group of coefficients as determined for said one wiring and plural groups of coefficients included in said selected plural characteristic data.

4. A method for evaluating a driving characteristic according to claim 2, wherein said stop (f) comprises:

(f1) executing circuit simulation of an operation of said device at driving of each of said plurality of reference wirings by said device, said circuit simulation being executed by using said group of coefficients as determined for each of said plurality of reference wirings; and (f2) determining a driving characteristic of said device for each of said plurality of reference wirings, based upon a result of said circuit simulation of the operation of said device at driving of said each reference wiring by said device.

5. A method for evaluating a driving characteristic according to claim 4, wherein said step (f1) comprises the steps of:

determining a single stage of an RC $\pi$ equivalent circuit for each reference wiring so that a group of lower-order coefficients of series expansion form of complex admittance of said equivalent circuit is substantially the same as said group of coefficients as determined for said each reference wiring; and executing said circuit simulation to combination of said device and said equivalent circuit as determined for each of said plurality of reference wirings.

6. A method for evaluating a driving characteristic according to claim 1, wherein said determining step (c) of said group of coefficients for said one wiring comprises the steps of:

(c1) sequentially selecting said group of wiring patterns constituting said one wiring, by starting from one of said group of wiring patterns from a start point of said one wiring at which said devise is connected to said one wiring;

(c2) determining a group of coefficients of series expansion form of complex admittance of a portion of said one wiring from a start point of said selected wiring pattern to an end point of said one wiring; and (c3) executing said determining step (c2) to each of said group of wiring patterns in response to selection of said each wiring pattern by said stop (c1), until said determining step (c2) is executed to one of said group of wiring patterns nearest to said start point of said one wiring;

wherein said determining step (c2) comprising the steps of;

determining a group of coefficients of series expansion form of complex admittance of said selected wiring pattern, from said values of resistance and capacitance as calculated for said selected wiring pattern and, as said group of coefficients for said portion of said one wiring from a starting point of said selected wiring pattern to an end point of said one wiring, in case there is no wiring pattern nearer to said end point of said one wiring pattern than said selected wiring pattern; and determining said group of coefficients of series expansion form of complex admittance of said portion of said one wiring from said start point of said selected wiring pattern to said end point of said one wiring, based upon said values of resistance and capacitance as calculated for said selected wiring pattern and said group of coefficients already determining for one of said group of wiring patterns which is adjacent to said selected wiring pattern and located nearer to said end point of said one wiring, in case there is at least one wiring pattern nearer to said end point of said one wiring pattern than said selected wiring pattern.

7. A method for evaluating a driving characteristic of a device for a wiring according to claim 1, wherein said determined driving characteristic includes signal delay time of said device.

8. A method for evaluating a driving characteristic of a device for a wiring according to claim 1, wherein said determined driving characteristic includes power dissipation of said device.

9. A method for evaluating a driving characteristic of a device for one of a plurality of wirings included in a circuit to be formed on a substrate, based upon design data which includes data specifying wiring patterns which constitute different portions of the plurality of wiring, the driving characteristic indicating a characteristic of an operation of said device at driving of one of said plurality of wirings by said device, said method comprising the steps executed by a computer, the steps including:

(a) calculating a value of a static capacitance between each of a group of wiring patterns constituting each of said plurality of wirings and other wiring patterns constituting others of said plurality of wirings different from said wiring, based upon said design data;

(b) calculating a value of resistance of each of said group of wiring patterns constituting each wiring, based upon said design data;

(c) determining a group of lower-order coefficients of series expansion form of complex admittance of each wiring, based upon said value of static capacitance calculated for each of said group of wiring patterns constituting said each wiring and said value of resistance calculated for each of said group of wiring patterns constituting said each wiring; and (d) determining each of driving characteristics of devices each connected to one of said plurality of wirings, based upon said group of lower-order coefficients as determined for said each wiring.

10. A method for evaluating a driving characteristic of a device for a wiring according to claim 9, further comprising the steps of:

dividing said substrate into a plurality of regions;

judging one of said plurality of regions to which each wiring pattern belongs; and storing information related to said each wiring pattern into one of a plurality of storage regions, said plurality of storage regions being provided within said memory in correspondence to said plurality of regions of said substrate, and said one storage region being one corresponding to one of said plurality of regions of said substrate to which said each wiring pattern belongs;

wherein said calculating step (a) comprises the steps of:

detecting, for each wiring pattern, a plurality of other wiring patterns belonging to a same one of said regions of said substrate to which said each wiring pattern belongs, based upon information stored in one of said plurality of storage regions corresponding to said same one regions of said substrate; and calculating, for said each wiring pattern, a sum of values of static capacitances between said each wiring pattern and said other wiring patterns based upon said design data, as said value of capacitance of said each wiring pattern.

11. A method for evaluating a driving characteristic of a device for one of a plurality of wirings included in a circuit to be formed on a substrate, based upon design data which includes data specifying wiring patterns which constitute different portions of the plurality of wiring, the driving characteristic indicating a characteristic of an operation of said device at driving of said one wiring by said device, said method comprising the steps executed by a computer, the steps including:

(a) calculating a value of a static capacitance between each group of wiring patterns constituting one of said plurality of wirings and other wiring patterns constituting one of said plurality of wirings and other wiring patterns constituting others of said plurality of wiring patterns, based upon said design data;

(b) calculating a value of resistance of each of said group of wiring patterns, based upon said design data; and (c) determining a driving characteristic of a device connected to said one wiring, based upon said values of static capacitance and resistance as calculated for each of said group of wiring patterns.

12. A method for evaluating a driving characteristic of a device for a wiring according to claim 11, wherein said determined driving characteristic includes signal delay time of said device.

13. A method for evaluating a driving characteristic of a device for a wiring according to claim 11, wherein said determined driving characteristic includes power dissipation of said device.

14. A method for evaluating a driving characteristic of a device for a wiring according to claim 11, wherein said determining stop (c) of said driving characteristic Is executed based upon a plurality of equivalent circuits each representing one of said group of wiring patterns, wherein each equivalent circuit comprises series connection of a resistance and a capacitance, wherein an output terminal of said equivalent circuit is connected to one of two ends of said resistance connected to said capacitance, and an input terminal of said equivalent circuit is connected to another of said two ends of said resistance, wherein said resistance and said capacitance have the values calculated for one of said group of wiring patterns represented by said each equivalent circuit.

15. A method for evaluating a driving characteristic of a device for a wiring according to claim 11, wherein said determining step (c) of said driving characteristic comprises:

determining data representing admittance of said one wiring, based upon said values of said resistance and said capacitance as calculated for each of said group of wiring patterns; and determining said driving characteristic, based upon said determined data representing said admittance.

16. A method for evaluating a driving characteristic of a device for a wiring according to claim 15, wherein said data representing admittance of said one wiring includes a group of lower-order coefficients of series expansion form of complex admittance of said one wiring.

17. A method for evaluating a driving characteristic of a device for a wiring, the driving characteristic indicating a characteristic of an operation of said device at driving of said wiring by said device, said method comprising the steps executed by a computer, the steps including:

(a) calculating values of a capacitance and a resistance of each of a group of wiring patterns constituting difference portions of a wiring;

(b) determining an equivalent circuit for said wiring, based upon said values of a capacitance and a resistance calculated for each of said group of wiring patterns, said equivalent circuit being comprised of a single stage of a circuit;

(c) executing circuit simulation of an operation of a device connected to said wiring which said device will perform when said device drives said wiring, by using said determined equivalent circuit; and (d) determining a driving characteristic of said device for said wiring, based upon a result of said circuit simulation.

18. A method for evaluating a driving characteristic of a device for a wiring according to claim 17, wherein said equivalent circuit is comprised of a single stage of an RC $\pi$ circuit.

19. A method for evaluating a driving characteristic of a device for a wiring according to claim 17, wherein said determining step (b) of said equivalent circuit comprises:

determining a group of lower-order coefficients of series expansion form of complex admittance of said wiring, based upon said values of a capacitance and a resistance calculated for each of said group of wiring patterns; and determining said equivalent circuit of said wiring, based upon said determined group of coefficients, so that a group of lower-order coefficients of series expansion form of complex admittance of said equivalent circuit substantially coincides with said group of coefficients determined for said wiring.

20. A method for evaluating a value of capacitance of each of a plurality of wiring patterns which constitute different portions of a plurality of wirings included in a circuit to be formed on a substrate, based upon a plurality of parts information portions included in design data of said circuit, each parts information portions specifying one of said plurality of wiring patterns, said method comprising the steps executed by a computer, the steps including:

(a) storing said plurality of parts information portions into a memory of said computer;

(b) dividing said substrate into a plurality of regions;

(c) detecting, for each of said plurality of wiring patterns, one of said plurality of regions of said substrate to which said each wiring pattern belongs, based upon said plurality of parts information portions stored in said memory;

(d) detecting, for said each wiring pattern, a plurality of other wiring patterns belonging to said one region of said substrate to which said each wiring pattern belongs, based upon said parts information portions stored; and (e) calculating, for said each wiring pattern, a value of static capacitance between said each wiring pattern and said plurality of other wiring patterns as a capacitance of said each wiring pattern based upon said plurality of parts information portions stored.

21. A method for evaluating value of capacitance according to claim 20, further comprising the step of:

(f) detecting, for each wiring pattern and based upon said plurality of parts information portions, whether each of said plurality of other wiring patterns as detected in said detecting step (d) for said each wiring pattern has a portion located within a predetermined distance from a portion of said each wiring pattern;

wherein said calculating step (e) is executed for limited ones of said plurality of other wiring patterns which have been detected in said detecting step (f) as ones having a portion located within said distance from said each wiring pattern.

22. A method for evaluating value of capacitance according to claim 20, wherein said wiring design data further includes capacitance information which indicates values of capacitance between plural pairs of portions of unit length, said portions of each pair having one of predetermined relative positions and representing a first portion of unit length included in one of said wiring patterns and a second portion of unit length included in another of said plurality of wiring patterns;

wherein said calculating step (e) comprising the steps of:
calculating a value of capacitance between each wiring pattern and each one of said limited ones of said plurality of other wiring patterns as detected in said step (f) for said each wiring pattern, by summing up values of capacitances between different portions of unit length of said each wiring patterns and different portions of unit length of said each one of said limited wiring patterns, wherein said capacitance of said different portions of said each wiring pattern and said different portions of said each one wiring pattern is calculated by reference to said capacitance information based upon positional relations of said different portions of said each wiring pattern and said different portions of said each one of said limited wiring patterns; and summing up said value of capacitance calculated for said each wiring pattern and each one of said limited wiring patterns.

23. A method for evaluating a driving characteristic according to claim 1, further comprising the steps of:
dividing said substrate into a plurality of regions;

detecting, for each of said plurality of wiring patterns, one of said plurality of regions of said substrate to which said each wiring pattern belongs, based upon said design data; and detecting, for said each wiring pattern, a plurality of other wiring patterns belonging to said one region of said substrate to which said each wiring pattern belongs, based upon a result of said detecting step of said plurality of other wiring patterns;

wherein said calculating step comprises a step of calculating a value of static capacitance between said each wiring pattern and said plurality of other wiring patterns as a capacitance of said each wiring pattern, based upon said design data.

24. A method for evaluating a driving characteristic according to claim 23, further comprising a step of storing, for said each wiring pattern, information related to said each wiring pattern into one of a plurality of region management tables, said plurality of region management tables being provided in correspondence to said plurality of regions of said substrate, and said one region management table being one corresponding to one of said plurality of regions of said substrate which has been detected as one to which said each wiring pattern belongs;

wherein said detecting step of said plurality of other wiring patterns is based upon information stored in said one region management table.

25. A method for evaluating a driving characteristic according to claim 11, further comprising the steps of:
dividing said substrate into a plurality of regions;

detecting, for each of said plurality of wiring patterns, one of said plurality of regions of said substrate to which said each wiring pattern belongs, based upon said design data; and detecting, for said each wiring pattern, a plurality of other wiring patterns belonging to said one region of said substrate to which said each wiring pattern belongs, based upon a result of said detecting step of said plurality of other wiring patterns;

wherein said calculating step comprises a step of calculating a value of static capacitance between said each wiring pattern and said plurality of other wiring patterns as a capacitance of said each wiring pattern, based upon said design data.

26. A method for evaluating a driving characteristic according to claim 25, further comprising a step of storing, for said each wiring pattern, information related to said each wiring pattern into one of a plurality of region management table, said plurality of region management table being provided in correspondence to said plurality of regions of said substrate, and said one region management table being one corresponding to one of said plurality of regions of said substrate which has been detected as one to which said each wiring pattern belongs;

wherein said detecting step of said plurality of other wiring patterns is based upon information stored in said one region management table.

27. A method for evaluating a value of capacitance according to claim 20, further comprising a step of storing, for said each wiring pattern, information related to said each wiring pattern into one of a plurality of region management table provided in said memory, said plurality of region management table being provided in correspondence to said plurality of regions of said substrate, and said one region management table being one corresponding to one of said plurality of regions of said substrate which has been detected as one to which said each wiring pattern belongs;

wherein said detecting step (d) is based upon information stored in said one region management table.

28. A method for evaluating value of capacitance according to claim 27, wherein said information related to each wiring pattern as stored in one of said regions management tables includes an address of one of said plurality of parts information portions which specifies said each wiring pattern;

wherein said calculating step (e) includes reading out from said memory, for said each wiring pattern, a group of parts information portions each specifying one of said plurality of other wiring patterns, based upon addresses stored in said one region management table corresponding to said one region of said substrate.

29. A method for evaluating a driving characteristic of a device for one of a plurality of wirings included in a circuit to be formed on a substrate, based upon design data which includes data specifying wiring patterns which constitute different portions of the plurality of wirings, the driving characteristic indicating a characteristic of an operation of said device at driving of said one wiring by said device, said method comprising the steps executed by a computer, the steps including:

dividing said substrate into a plurality of regions;

detecting, for each of said plurality of wiring patterns, one of said plurality of regions of said substrate to which said each wiring pattern belongs, based upon said design data; and detecting, for said each wiring pattern, a plurality of other wiring patterns belonging to said one region of said substrate to which said each wiring pattern belongs, based upon a result of said detecting step of said plurality of other wiring patterns;

calculating a value of a static capacitance of a portion of each of the plurality of wiring patterns belonging to one of the regions using said design data;

calculating a value of resistance of a portion of each of the plurality of wiring patterns belonging to said one of the regions using said design data;

determining a group of lower-order coefficients of series expansion form of complex admittance of said one wiring, based upon said value of static capacitance calculated for each of said group of wiring patterns and said value of resistance calculated for said each of said group of wiring patterns; and determining a driving characteristic of a device connected to said one wiring, based upon said group of lower-order coefficients as determined for said one wiring.

30. A method for evaluating a driving characteristic according to claim 29, further comprising a step of storing, for said each wiring pattern, information related to said each wiring pattern into one of a plurality of region management tables, said plurality of region management tables being provided in correspondence to said plurality of regions of said substrate, and said one region management table being one corresponding to one of said plurality of regions of said substrate which has been detected as one to which said each wiring pattern belongs;

wherein said detecting step of said plurality of other wiring patterns is based upon information stored in said one region management table.

31. A method for evaluating a driving characteristic of a device for one of a plurality of wirings included in a circuit to be formed on a substrate, based upon design data which includes data specifying wiring patterns which constitute different portions of the plurality of wirings, the driving characteristic indicating a characteristic of an operation of said device at driving of one of said plurality of wirings by said device, said method comprising the steps executed by a computer, the steps including:

dividing said substrate into a plurality of regions;

judging one of said plurality of regions to which each wiring pattern belongs; and storing information related to said each wiring pattern into one of a plurality of storage regions, said plurality of storage regions being provided within said memory in correspondence to said plurality of regions of said substrate, and said one storage region being one corresponding to one of said plurality of regions of said substrate to which said each wiring pattern belongs;

calculating a value of a static capacitance of a portion of each of the plurality of wiring patterns belonging to one of the regions using said design data, wherein said calculating step comprises the steps of:

detecting, for each wiring pattern, a plurality of other wiring patterns belonging to said same one of said regions of said substrate to which said each wiring pattern belongs based upon information stored in one of said plurality of storage regions corresponding to said same one region of said substrate; and calculating, for said each wiring pattern, a sum of values of static capacitances between said each wiring pattern and said other wiring patterns based upon said design data, as said value of capacitance of said each wiring pattern;

calculating a value of resistance of a portion of each of the plurality of wiring patterns belonging to said one of the regions using said design data;

determining a group of lower-order coefficients of series expansion form of complex admittance of each wiring, based upon said value of static capacitance calculated for each of said plurality of wiring patterns constituting said each wiring and said value of resistance calculated for each of said plurality of wiring patterns constituting said each wiring; and determining each of driving characteristics of devices each connected to one of said plurality of wirings, based upon said group of lower-order coefficients as determined for said each wiring.

32. A method for evaluating a driving characteristic of a device for one of a plurality of wirings included in a circuit to be formed on a substrate, based upon design data which includes data specifying wiring patterns which constitute different portions of the plurality of wirings, the driving characteristics indicating a characteristic of an operation of said device at driving of said one wiring by said device, said method comprising the steps executed by a computer, the steps including:

dividing said substrate into a plurality of regions;

detecting, for each of said plurality of wiring patterns, one of said plurality of regions of said substrate to which said each wiring pattern belongs, based upon said design data;

detecting, for said each wiring pattern, a plurality of other wiring patterns belonging to said one region of said substrate to which said each wiring pattern belongs, based upon a result of said detecting step of said plurality of other wiring patterns;

calculating a value of a static capacitance between each group of wiring patterns constituting one of said plurality of wirings and other wiring patterns constituting one of said plurality of wirings and other wiring patterns constituting others of said plurality of wiring patterns, based upon said design data, wherein said calculating step comprises a step of calculating a value of static capacitance between said each wiring pattern and said plurality of other wiring patterns as a capacitance of said each wiring pattern, based upon said design data;

calculating a value of resistance of each of said group of wiring patterns, based upon said design data; and determining a driving characteristic of a device connected to said one wiring, based upon said values of static capacitance and resistance as calculated for each of said group of wiring patterns.

33. A method for evaluating a driving characteristic according to claim 32, further comprising a step of storing, for said each wiring pattern, information related to said each wiring pattern into one of a plurality of region management tables, said plurality of region management tables being provided in correspondence to said plurality of regions of said substrate, and said one region management table being one corresponding to one of said plurality of regions of said substrate which has been detected as one to which said each wiring pattern belongs;

wherein said detecting step of said plurality of other wiring patterns is based upon information stored in said one region management table.

34. A method for evaluating a value of capacitance of each of a plurality of wiring patterns which constitute different portions of a plurality of wirings included in a circuit to be formed on a substrate, based upon a plurality of parts information portions included in design data of said circuit, each parts information portions specifying one of said plurality of wiring patterns, said method comprising the steps executed by a computer, the steps including:

(a) storing said plurality of parts information portions into a memory of said computer;

(b) dividing said substrate into a plurality of regions;

(c) detecting, for each of said plurality of wiring patterns, one of said plurality of regions of said substrate to which said each wiring pattern belongs, based upon said plurality of parts information portions stored in said memory;

(d) detecting, for said each wiring pattern, a plurality of other wiring patterns belonging to said one region of said substrate to which said each wiring pattern belongs, based upon said parts information portions stored; and (e) calculating, for said each wiring pattern, a value of static capacitance between said each wiring pattern and said plurality of other wiring patterns as a capacitance of said each wiring pattern based upon said plurality of parts information portions stored (f) storing, for said each wiring pattern, information related to said each wiring pattern into one of a plurality of region management table provided in said memory, said plurality of region management table being provided in correspondence to said plurality of regions of said substrate, and said one region management table being one corresponding to one of said plurality of regions of said substrate which has been detected as one to which said each wiring pattern belongs;

wherein said detecting step (d) is based upon information stored in said one region management table.

35. A method for evaluating value of capacitance according to claim 34, wherein said information related to each wiring pattern as stored in one of said regions management tables includes an address of one of said plurality of parts information portions which specifies said each wiring pattern; and, wherein said calculating step (e) includes reading out from said memory, for said each wiring pattern, a group of parts information portions each specifying one of said plurality of other wiring patterns, based upon addresses stored in said one region management table corresponding to said one region of said substrate.

36. A method for evaluating a driving characteristic of a device for a wiring, the driving characteristic indicating a characteristic of an operation of said device at driving of said wiring by said device, the wiring having a plurality of wiring patterns, said method comprising the steps executed by a computer, the steps including:

(a) dividing said wiring into a plurality of regions;

(b) calculating, for one of said plurality of wiring patterns in one of the regions, a value of a static capacitance between said one of wiring patterns and each of other wiring patterns in the region (c) calculating, for said one of wiring patterns, a total capacitance by summing the capacitances calculated with said each of other wiring patterns;

(d) calculating a value of resistance of said one of said plurality of wiring patterns;

(e) repeating steps (b) through (d) for other ones of said plurality of wiring patterns;

(f) calculating lower-order coefficients of an expansion form of an admittance matrix for said wiring based upon capacitances, each calculated for said one of said plurality of wiring patterns, and based upon resistances, each calculated for said one of said plurality of wiring patterns; and, (g) determining a driving characteristic of the device based upon said lower-order coefficients.

37. A method for evaluating a driving characteristic of a device for one of a plurality of wirings included in a circuit to be formed on a substrate, based upon design data which includes data specifying wiring patterns which constitute different portions of the plurality of wirings, the driving characteristic indicating a characteristic of an operation of said device at driving of said one wiring by said device, said method comprising the steps executed by a computer, the steps including:

(a) calculating a value of a static capacitance between each of a group of wiring patterns constituting one of said plurality of wirings and other wiring patterns constituting others of said plurality of wiring patterns, based upon said design data;

(b) calculating a value of resistance of each of said group of wiring patterns, based upon said design data;

(c) determining a group of lower-order coefficients of series expansion form of complex admittance of said one wiring, based upon said value of static capacitance calculated for each of said group of wiring patterns and said value of resistance calculated for said each of said group of wiring patterns;

(d) determining a driving characteristic of a device connected to said one wiring, based upon said group of lower-order coefficients as determined for said one wiring;

(e) determining a group of lower-order coefficients of series expansion form of complex admittance of each of a plurality of reference wirings predetermined for evaluation purpose;

(f) determining a plurality of reference driving characteristics of said device each of which indicates a driving characteristic of said device at driving of one of said plurality of reference wirings by said device; and (g) storing a plurality of characteristic data each of which includes a group of coefficients as determined for one of said plurality of reference wirings and a driving characteristic as determined for said one reference wiring;

wherein said determining of said driving characteristic of said device for said one wiring comprises:

(d1) determining said driving characteristic of said device for said one wiring, based upon said group of lower-order coefficients as determined for said one wiring and said plurality of stored characteristic data.

38. A method for evaluating a driving characteristic of a device for one of a plurality of wirings included in a circuit to be formed on a substrate, based upon design data which includes data specifying wiring patterns which constitute different portions of the plurality of wirings, the driving characteristic indicating a characteristic of an operation of said device at driving of said one wiring by said device, said method comprising the steps executed by a computer, the steps including:

(a) calculating a value of a static capacitance between each of a group of wiring patterns constituting one of said plurality of wirings and other wiring patterns constituting others of said plurality of wiring patterns, based upon said design data;

(b) calculating a value of resistance of each of said group of wiring patterns, based upon said design data;

(c) determining a group of lower-order coefficients of series expansion form of complex admittance of said one wiring, based upon said value of static capacitance calculated for each of said group of wiring patterns and said value of resistance calculated for said each of said group of wiring patterns, wherein determining step (c) comprises the steps of:

(c1) sequentially selecting said group of wiring patterns constituting said one wiring, by starting from one of said group of wiring patterns from a start point of said one wiring at which said device is connected to said one wiring;

(c2) determining a group of coefficients of series expansion form of complex admittance of a portion of said one wiring from a start point of said selected wiring pattern to an end point of said one wiring; wherein said determining step (c2) comprises the steps of:

determining a group of coefficients of series expansion form of complex admittance of said selected wiring pattern, from said values of resistance and capacitance as calculated for said selected wiring pattern and, as said group of coefficients for said portion of said one wiring from a starting point of said selected wiring pattern to an end point of said one wiring, in case there is no wiring pattern nearer to said end point of said one wiring pattern than said selected wiring pattern; and determining said group of coefficients of series expansion form of complex admittance of said portion of said one wiring from said start point of said selected wiring pattern to said end point of said one wiring, based upon said values of resistance and capacitance as calculated for said selected wiring pattern and said group of coefficients already determining for one of said group of wiring patterns which is adjacent to said selected wiring pattern and located nearer to said end point of said one wiring, in case there is at least one wiring pattern nearer to said end point of said one wiring pattern than said selected wiring pattern; and (c3) executing said determining step (c2) to each of said group of wiring patterns in response to selection of said each wiring pattern by said step (c1), until said determining step (c2) is executed to one of said group of wiring patterns nearest to said start point of said one wiring; and, (d) determining a driving characteristic of a device connected to said one wiring, based upon said group of lower-order coefficients as determined for said one wiring.

* * * * *